(12) United States Patent
Nakashiba

(10) Patent No.: US 6,201,268 B1
(45) Date of Patent: *Mar. 13, 2001

(54) OUTPUT STRUCTURE OF CHARGE-COUPLED DEVICE AND METHOD FOR FABRICATING THE SAME

(75) Inventor: Yasutaka Nakashiba, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/484,379

(22) Filed: Jun. 7, 1995

Related U.S. Application Data

(63) Continuation of application No. 08/395,766, filed on Feb. 28, 1995, now abandoned, which is a continuation of application No. 08/024,652, filed on Mar. 1, 1993, now abandoned.

(30) Foreign Application Priority Data

Mar. 2, 1992 (JP) .................................................... 4-44711

(51) Int. Cl.$^7$ ........................ H01L 29/768; G11C 19/28

(52) U.S. Cl. .............................................. 257/239; 377/60
(58) Field of Search .............................. 257/239; 377/60

(56) References Cited

U.S. PATENT DOCUMENTS

| | | | |
|---|---|---|---|
| 4,660,064 | * 4/1987 | Hamasaki | 257/239 |
| 4,698,656 | * 10/1987 | Kamata | 257/239 |
| 5,103,278 | * 4/1992 | Miwada | 257/239 |
| 5,239,192 | * 8/1993 | Hirota | 257/239 |

* cited by examiner

Primary Examiner—Gene M. Munson
(74) Attorney, Agent, or Firm—Laff, Whitesel & Saret, Ltd.; J. Warren Whitesel

(57) ABSTRACT

A charge-coupled device has a first P-type well layer which forms a charge transfer section and a second P-type well layer which forms a floating diffusion layer section and within which the first P-type well layer is formed. The second P-type well layer below the floating diffusion layer section has an impurity concentration lower than that of the first P-type well layer whereby a depletion layer formed therein by a PN-junction flares in the direction to the second P-type well layer. With this arrangement, it is made possible to reduce the floating diffusion capacitance and to maintain a large output voltage with respect to a signal electron charge.

5 Claims, 3 Drawing Sheets

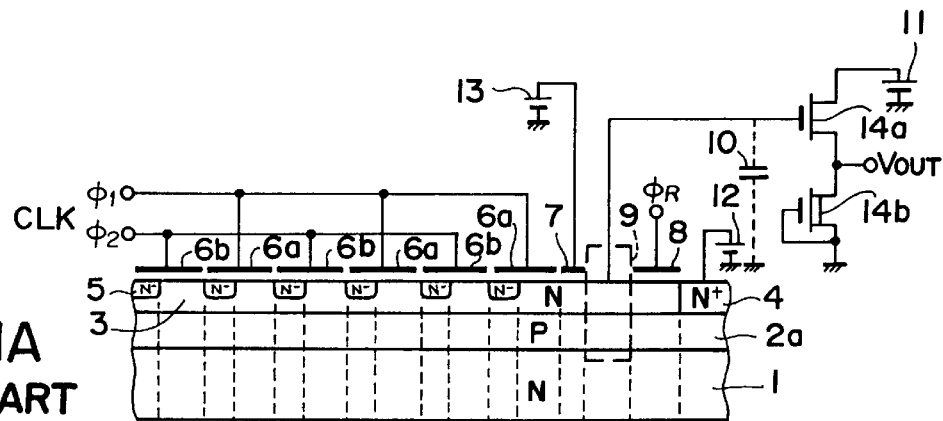
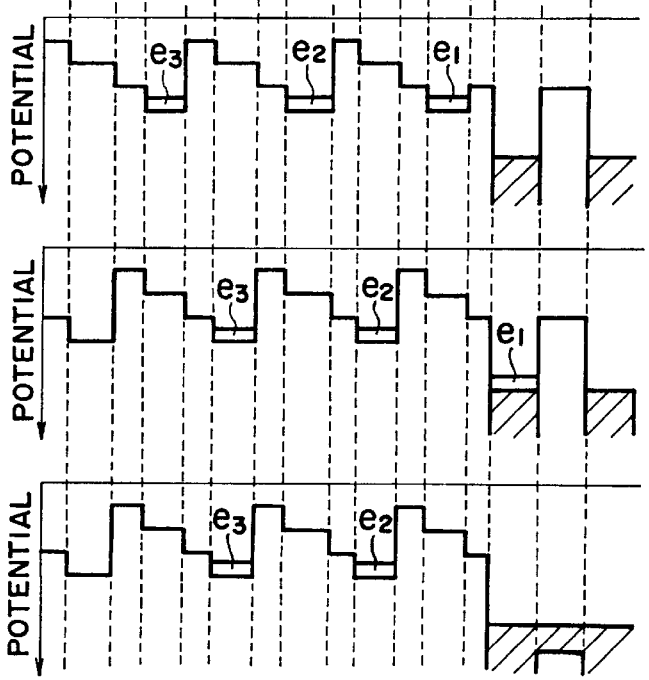
FIG. 1A PRIOR ART
FIG. 1B PRIOR ART
FIG. 1C PRIOR ART
FIG. 1D PRIOR ART

OUTPUT STRUCTURE OF CHARGE-COUPLED DEVICE AND METHOD FOR FABRICATING THE SAME

This application is a continuation of Ser. No. 08/395,766 filed on Feb. 28, 1995, now abandoned, which was a continuation of Ser. No. 08/024,652, filed Mar. 1, 1993, now abandoned.

BACKGROUND OF THE INVENTION (1) Field of the Invention

The present invention relates to a semiconductor device and a fabrication method therefor, and more particularly to an output structure of a charge-coupled device in which a charge-voltage conversion efficiency is highly enhanced.

(2) Description of the Related Art

Generally, an output of a charge-coupled device is taken out through an output circuit which performs a conversion from a signal electron charge into a voltage.

A typical example of a charge-coupled device having a conventional output structure is shown in a diagrammatic sectional view in FIG. 1A. That relates to a floating diffusion amplifier and is disclosed under "Two-Phase Charge-Coupled Devices with Overlapping Polysilicon and Aluminum Gates" by W. F. Kosonocky and J. E. Carnes in RCA Review Vol. 34, March 1973, pp 164–202.

In the charge-coupled device having the conventional output structure shown in FIG. 1A, a P-type well layer 2a (with impurity or doping concentration of about $1.0 \times 10^{16}$ cm $^{-3}$) for preventing a punch-through of an N$^+$-type semiconductor region 4 and constituting a charge transfer section and a floating diffusion layer section 9 is formed on an N-type semiconductor substrate 1 (with impurity concentration of about $2.0 \times 10^{14}$ cm$^{-3}$). In the P-type well layer 2a, an N-type semiconductor region 3 (with impurity concentration of about $1.0-10^{17}$ cm$^{-3}$) constituting the charge transfer section and the floating diffusion layer section 9 and the N$^+$-type semiconductor region 4 (with impurity concentration of about $1.0 \times 10^{20}$ cm$^{-3}$) for providing a reset potential are formed. Also, at a portion of the N-type semiconductor region 3 of the charge transfer section, N$^-$-type semiconductor regions 5 are formed and, further, conductive electrodes of polycrystalline silicon such as charge transfer electrodes 6a and 6b, an output gate electrode 7, and a reset gate electrode 8 are formed through a gate insulating film. Further, numerals 11 and 13 denote a power supply voltage and an output gate voltage, respectively.

In the arrangement shown in the drawings, transfer clock voltages $\phi_{1,2}$ whose phases are opposite to each other are applied to the two clock signal lines connected to the transfer electrodes and the signal electron charges existing below the electrodes are sequentially transferred to the output gate electrode 7 and the floating diffusion layer section 9, with a result that the charge - voltage conversion is made by the MOS transistors 14a and 14b.

The detail of the above performance is explained further with reference to potential profiles shown in FIGS. 1B, 1C and 1D.

When a reset clock voltage $\phi_R$ is applied, the reset gate electrode 8 turns ON and the potential of the floating diffusion layer section 9 is set to the same voltage as the reset voltage 12. Then, the reset gate electrode 8 is set to OFF for detecting the signal electron charge (see FIG. 1B).

Subsequently, when the transfer clock voltages $\phi_{1,2}$ whose phases are opposite to each other are applied to the clock signal lines connected to the transfer electrodes 6a and 6b, the potentials below the transfer electrodes 6a and 6b are caused to change, and each of the signal electron charges e1, e3, e3. . . is transferred one step each. Here, the signal electron charge e1 is transferred to the floating diffusion layer section 9 through the output gate electrode 7. (See FIG. 1C) The potential change due to the signal electron charge e1 thus transferred is subjected to impedance conversion by the source-follower amplifier constituted by the MOS transistors 14a and 14b, so that an voltage output is taken out from an output terminal $V_{OUT}$. Here, assuming that the amount of the signal electron charge transferred is Q, the floating diffusion capacitance 10 is C, and the voltage gain of the source-follower amplifier is G, the signal output V outputted from the output terminal $V_{OUT}$ may be expressed by the following equation:

$$V = Q/C \cdot G$$

Next, the reset gate electrode 8 is turned ON for detecting the next signal electron charge, and the potential of the floating diffusion layer section 9 is set to the same voltage as the reset voltage 12 (see FIG. 1D).

By repeating the above operation, signal electron charges sequentially transferred through the charge transfer electrodes 6a and 6b can be taken out as output signals from the output terminal $V_{OUT}$.

In the charge-coupled device having the conventional output structure as explained above, since the magnitude of the output voltage with respect to the amount of the signal electron charge is inversely proportional to the magnitude of the floating diffusion capacitance 10, it has been attempted, in coping with the miniaturization of the charge-coupled device, to reduce the area of the floating diffusion layer section 9 and the volume of the base area thereof in order to maintain the stable and enhanced response with which the device operates.

On the other hand, in the charge-coupled device having the conventional output structure as explained above, since the magnitude of the amount of the signal electron charges dealt with is proportional to the area of the charge transfer section, what has been done in an attempt to maintain or enhance such magnitude of the amount of the signal electron charges in coping with the miniaturization of the charge-coupled device is to increase the charge transfer capacitance per unit area. To this end, the junction between the P-type well layer 2a and the N-type semiconductor region 3 is formed sharrowly so that the junction capacitance therebetween becomes large, by increasing a concentration of the P-type well region of the charge transfer section.

The above involves contradictions in the attempted operations so that, despite the area reduction being made in the floating diffusion capacitance 10 in coping with the miniaturization of charge-coupled devices, the intended objectives have not been sufficiently met. This is a problem to be solved by the invention, in a charge-coupled device having the conventional output structure.

SUMMARY OF THE INVENTION

It is, therefore, an object of the present invention to overcome the problems existing in the conventional charge-coupled device and to provide an improved output structure of the charge-coupled device with which the charge-voltage conversion efficiency of the output structure can be enhanced.

According to one aspect of the invention, there is provided a charge-coupled device having a function wherein a charge-voltage conversion is performed by transferring a signal electron charge transferred from a charge transfer section formed in a semiconductor layer of a first-conductivity type to a floating diffusion layer section of a semiconductor region of a second-conductivity type, the charge-coupled device comprising:

a first well layer of the first-conductivity type which forms the charge transfer section; and a second well layer of the first-conductivity type which forms the floating diffusion layer section and within which the first well layer is formed, the second well layer below the floating diffusion layer section having an impurity concentration lower than that of the first well layer whereby a depletion layer formed therein by a PN-junction flares in a direction to the second well layer.

BRIEF DESCRIPTION OF THE DRAWINGS

The above and other objects, features and advantages of the present invention will be apparent from the following description of preferred embodiments of the invention explained with reference to the accompanying drawings, in which:

FIG. 1A is a diagrammatic sectional view of a prior art charge-coupled device;

FIGS. 1B, 1C and 1D are potential profiles associated to FIG. 1A;

DESCRIPTION OF THE PREFERRED EMBODIMENTS

Figure 2:
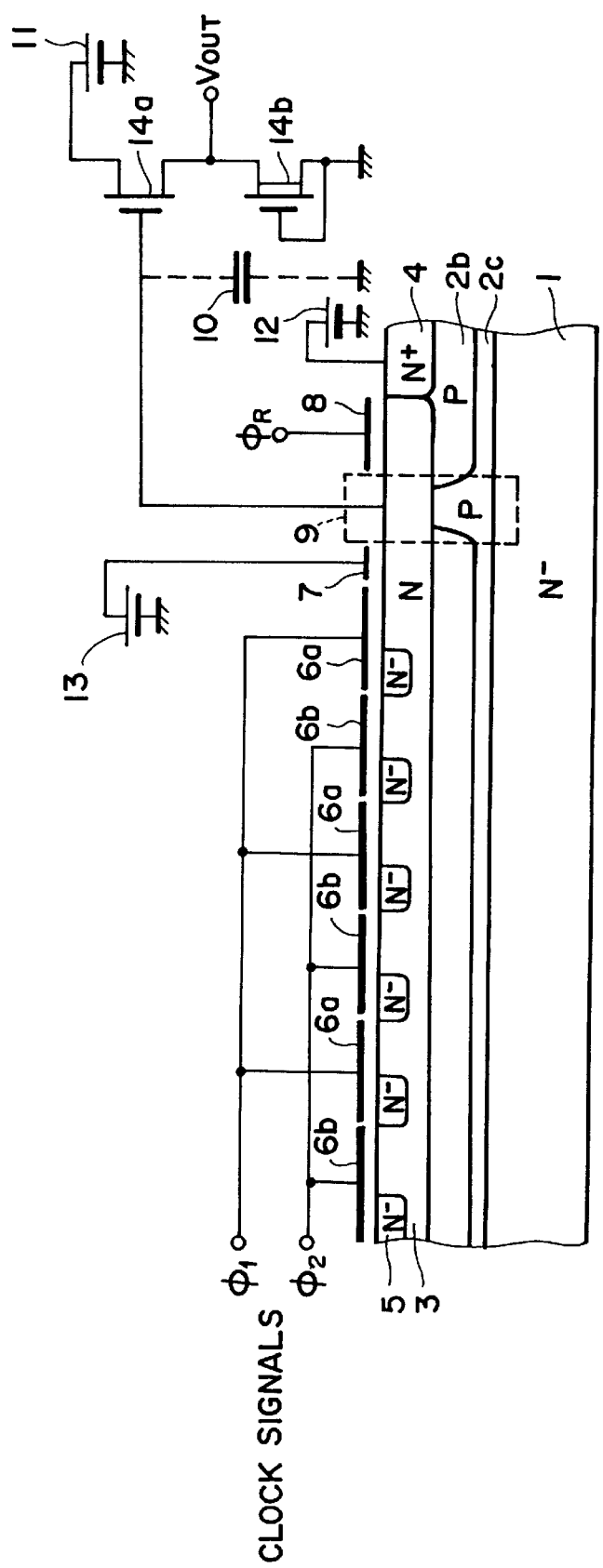
FIG. 2 is a diagrammatic sectional view of a charge-coupled device of a first embodiment according to the invention.
Figure 3:
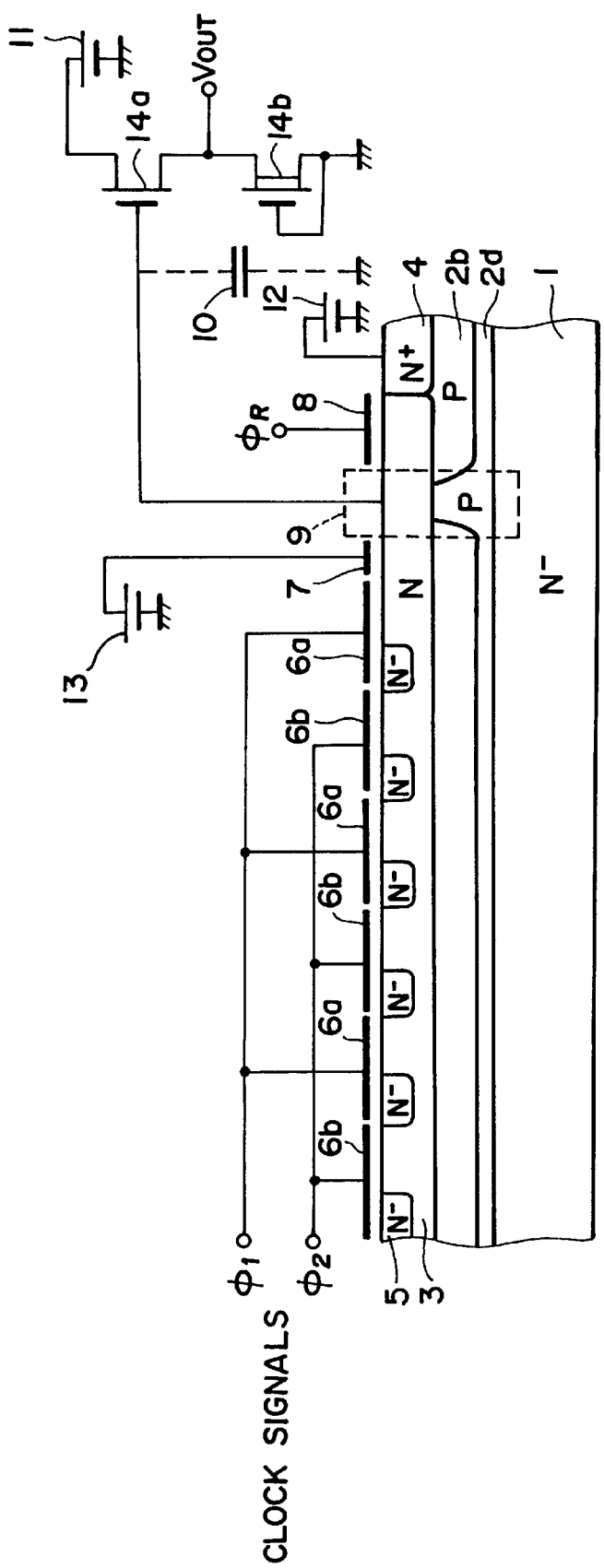
FIG. 3 is a diagrammatic sectional view of a charge-coupled device of a second embodiment according to the invention.

Now, preferred embodiments of the invention will be explained with reference to FIGS. 2 and 3. In FIGS. 2 and 3, it is to be noted that the same reference numerals are used and descriptions are omitted for the portions which are in common with those in the prior art arrangement shown in FIG. 1A.

FIG. 2 shows a first embodiment of a charge-coupled device according to the invention. This embodiment is different from the prior art shown in FIG. 1A in the point where a first P-type well layer 2b (with impurity concentration of about $1.0 \times 10^{16}$ cm$^{-3}$) for preventing a punch-through of an N$^+$-type semiconductor region 4 and constituting a charge transfer section is formed within a second P-type well layer 2c (with impurity concentration in a range between $5.0 \times 10^{14}$ cm$^{-3}$ and $5.0 \times 10^{15}$ cm$^{-3}$) which is formed by processes of ion-implantation of impurities and thermal diffusion.

The charge-coupled device according to this embodiment operates in the same way as the prior art device shown in FIG. 1A. However, since the impurity concentration of the region of the second P-type well layer 2c below the floating diffusion layer 9 is made lower than that of the first P-type well layer 2b, this enables the depletion layer formed by the PN-Junction to be widely flared towards the side of the second P-type well layer 2c.

For example, in the structure where the area of the floating diffusion layer section 9 is dimensioned such that the distance between the output gate electrode 7 and the reset gate electrode 8 is 6 μm, the distance between the element isolation regions is 8 μm, and the distance from the first P-type well layer 2b to both the output gate electrode 7 and the reset gate electrode 8 is 0.5 μm, it has been made possible to reduce the value of the floating diffusion capacitance 10 by about 30% as compared with that of the prior art.

Next, referring to FIG. 3, an arrangement of a charge-coupled device of a second embodiment according to the invention is explained.

This second embodiment is different from the prior art shown in FIG. 1A in the point where the first P-type well layer 2b (with impurity concentration of about $1.0 \times 10^{16}$ cm$^{-3}$) for preventing a punch-through of an N$^+$-type semiconductor region 4 and constituting a charge transfer section 9 is formed within a second P-type epitaxial layer 2d (with impurity concentration in a range between $5.0 \times 10^{14}$ cm$^{-3}$ and $5.0 \times 10^{15}$ cm$^{-3}$) which is formed by an epitaxial growth process.

The charge-coupled device having the output structure according to this second embodiment also operates in the same way as the prior art device shown in FIG. 1A. However, since the impurity concentration of the region of the second P-type epitaxial layer 2d below the floating diffusion layer 9 is made lower than that of the first P-type well layer 2b, this enables the depletion layer formed by the PN-junction to be widely flared towards the side of the second P-type epitaxial layer 2d.

For example, in the structure where the area of the floating diffusion layer section 9 is dimensioned such that the distance between the output gate electrode 7 and the reset gate electrode 8 is 6 μm, the distance between the element isolation regions is 8 μm, and the distance from the first P-type well layer 2b to both the output gate electrode 7 and the reset gate electrode 8 is 0.5 μm, it has been made possible to reduce the value of the floating diffusion capacitance 10 by about 30% as compared with that of the prior art.

As described above, the impurity concentration of the second P-type well layer 2c in the first embodiment and the second P-type epitaxial layer 2d in the second embodiment may be in a range between $5.0 \times 10^{14}$ cm$^{-3}$ and $5.0 \times 10^{15}$ cm$^{-3}$ in the case where the impurity concentration of the first P-type well layer 2b is about $1.0 \times 10^{16}$ cm$^{-3}$. A preferred impurity concentration within the above range is $1.0 \times 10^{15}$ cm$^{-3}$.

As explained above, according to the invention, since the impurity concentration of the P-type well layer region constituting the floating diffusion layer section 9 is made lower than that of the N$^+$-type semiconductor region and the P-type well layer region constituting the charge transfer section, the depletion layer formed by the PN-Junction can be made widely flared towards the side of the second P-type well layer 2c or the side of the second P-type epitaxial layer 2d. As a consequence, it is possible to reduce the value of the floating diffusion capacitance 10 by about 30% as compared with that in the prior art and to obtain a large output voltage from the signal electron charge. That is, the charge-voltage conversion efficiency of the output structure of the charge-coupled device according to the invention can be enhanced by about 30%.

What is claimed is:

1. A charge-coupled device having a function wherein a charge-voltage conversion is performed on a signal electron charge transferred from a charge transfer section (3) of a second-conductivity type which is formed within a semiconductor layer (2b, 2c) of a first-conductivity type, to a semiconductor region of a second-conductivity type in a floating diffusion layer section (9), said charge-coupled device comprising:

a first well layer (2b) of the first-conductivity type which underlines said charge transfer section (3); and a second well layer (2c) of the first-conductivity type which forms a part of said floating diffusion layer section (9) and within which said first well layer (2b) is formed, said second well layer (2c) being immediately below said semiconductor region of the second-conductivity type in said floating diffusion layer section (9), having an impurity concentration which is lower than an impurity concentration of said first well layer (2b) whereby a depletion layer formed in said floating diffusion layer section by a PN-junction flares in a direction toward said second well layer (2c).

2. A charge-coupled device according to claim 1, in which said first-conductivity type is a P-type and said second-conductivity is an N-type.

3. A charge-coupled device according to claim 1, in which said second well layer (2c) below said semiconductor region in said floating diffusion layer section has the impurity concentration in a range between $5.0 \times 10^{14}$–$5.0 \times 10^{15}$ cm$^{-3}$ and said first well layer (2b) has the impurity concentration of about $1.0 \times 10^{16}$ cm$^{-3}$.

4. A charge-coupled device according to claim 1, in which said second well layer is a layer formed by processes of ion-implantation of impurities and thermal diffusion.

5. A charge-coupled device according to claim 1, in which said second well layer is a layer formed by an epitaxial growth process.

* * * * *